(12) United States Patent
Philipsen

(10) Patent No.: US 12,406,885 B2
(45) Date of Patent: Sep. 2, 2025

(54) METHOD OF MANUFACTURING A SEMICONDUCTOR STRUCTURE

(71) Applicant: IMEC VZW, Leuven (BE)

(72) Inventor: Henricus Philipsen, Leuven (BE)

(73) Assignee: IMEC VZW, Leuven (BE)

( * ) Notice: Subject to any disclaimer, the term of this patent is extended or adjusted under 35 U.S.C. 154(b) by 657 days.

(21) Appl. No.: 17/354,046

(22) Filed: Jun. 22, 2021

(65) Prior Publication Data
US 2022/0172990 A1 Jun. 2, 2022

(30) Foreign Application Priority Data
Dec. 1, 2020 (EP) .................................... 20210907

(51) Int. Cl.
*H01L 21/768* (2006.01)

(52) U.S. Cl.
CPC .. *H01L 21/76897* (2013.01); *H01L 21/76802* (2013.01); *H01L 21/76843* (2013.01); *H01L 21/76865* (2013.01); *H01L 21/76883* (2013.01); *H01L 21/76886* (2013.01)

(58) Field of Classification Search
CPC ......... H01L 21/76802; H01L 21/78843; H01L 21/76865; H01L 21/76883; H01L 21/76886; H01L 21/76897
See application file for complete search history.

(56) References Cited

U.S. PATENT DOCUMENTS

| | | | |
|---|---|---|---|
| 7,071,100 B2 | 7/2006 | Chen et al. | |
| 7,749,906 B2 | 7/2010 | Dominguez et al. | |
| 9,406,555 B2 | 8/2016 | Deng | |
| 9,685,406 B1* | 6/2017 | Briggs | H01L 21/76811 |
| 9,711,397 B1* | 7/2017 | Bekiaris | H01L 21/76832 |
| 10,297,569 B2 | 5/2019 | Edelstein et al. | |

(Continued)

OTHER PUBLICATIONS

Extended European Search Report and Written Opinion, Application No. EP20210907.0, mailed Jun. 1, 2021, 5 pages.

(Continued)

*Primary Examiner* — Marcos D. Pizarro
(74) *Attorney, Agent, or Firm* — McDonnell Boehnen Hulbert & Berghoff LLP

(57) ABSTRACT

A method for manufacturing a semiconductor structure comprises providing a substrate that comprises a semiconductor layer and a filling material above the semiconductor layer. The filling material defines a plurality of trenches in a surface opposite the substrate. Feature material fills each trench and is selectively etched to form a pattern of recessed features. The substrate is then exposed to a first ambient environment that increases the etch resistance of the pattern of recessed features to an etchant that facilitates etching of a layer material within the trench that is arranged between the feature material and the filling material, to thereby modify at least an upper part of the pattern of recessed features. The layer material is partially etched with the etchant to form a recessed layer such that the layer material still remains between the filling material and the pattern of recessed features. The substrate is exposed to a second ambient environment that at least partially reverses modification of the upper part of the pattern of recessed features.

20 Claims, 8 Drawing Sheets

(56) References Cited

U.S. PATENT DOCUMENTS

| | | |
|---|---|---|
| 2011/0052797 A1* | 3/2011 | McFeely .................. C23C 8/24 |
| | | 427/96.8 |
| 2013/0032930 A1 | 2/2013 | Kawano |
| 2015/0126028 A1 | 5/2015 | Ryan et al. |
| 2018/0211873 A1 | 7/2018 | Witt |
| 2018/0240701 A1* | 8/2018 | Jia ..................... H01L 21/76877 |
| 2019/0067290 A1 | 2/2019 | Wang et al. |
| 2020/0135562 A1* | 4/2020 | Chen ................ H01L 21/31116 |

OTHER PUBLICATIONS

Liu, Guozhen, Jun Wang, Yahao Ge, Yuejin Wang, Shiqiang Lu, Yang Zhao, Yan Tang et al. "Cu Nanowires Passivated with Hexagonal Boron Nitride: An Ultrastable, Selectively Transparent Conductor." ACS nano 14, No. 6 (2020): 6761-6773.

Ohtake, Hiroto, Shinobu Saito, Munehiro Tada, Takahiro Onodera, and Yoshihiro Hayashi. "Plasma-etching technology with in situ etched-surface modification for highly reliable low-k/Cu dual damascene interconnects." IEEE transactions on semiconductor manufacturing 18, No. 4 (2005): 672-680.

Tan, K-M., T-Y. Liow, Rinus TP Lee, C-H. Tung, Ganesh S. Samudra, W-J. Yoo, and Y-C. Yeo. "Drive-current enhancement in FinFETs using gate-induced stress." IEEE electron device letters 27, No. 9 (2006): 769-771.

\* cited by examiner

METHOD OF MANUFACTURING A SEMICONDUCTOR STRUCTURE

CROSS-REFERENCE TO RELATED APPLICATIONS

The present application is a non-provisional patent application claiming priority to European Patent Application No. 20210907.0, filed on Dec. 1, 2020, the contents of which are hereby incorporated by reference.

FIELD OF THE DISCLOSURE

This application relates to a method of manufacturing a semiconductor structure.

BACKGROUND

Etching is one of the most crucial processing steps in semiconductor manufacturing as, for example, in the patterning of gate stacks or gate spacers in the Front End of Line (FEOL), in the patterning of inter-layer dielectrics for forming interconnects or intra-layer dielectrics for forming contact vias between different metal-containing features in the Back End of Line (BEOL), and for memory device fabrication.

Etching refers not only to the complete removal of a layer of a material to form the desired feature but also to partial removal of a layer of a material to end up with a slightly recessed feature. However, the etching process presents challenges since layers or features made of different materials are in jeopardy due to being prone to etch damage when subjected to non-selective etch chemistries. Etch damage can present itself as unwanted chemical dissolution or unwanted corrosion.

SUMMARY

Methods for protecting layers comprising metals during semiconductor manufacturing against wet-chemical dissolution or undesired corrosion are disclosed herein.

A first aspect relates to a method for manufacturing a semiconductor structure, the method comprising:
  providing a substrate comprising a semiconductor layer and having a main surface comprising a pattern of features, the features
    comprising a first metal,
    having top surfaces coplanar with the main surface,
    being embedded, in a first trench, by a layer comprising a second metal different from the first metal; and
    being separated at least partially by a filling material, wherein the layer comprising the second metal and the filling material have a top surface coplanar with the top surfaces of the features,
  partially etching the features selectively, thereby forming a pattern of recessed features,
  modifying at least an upper part of the recessed features by exposing the substrate to a first ambient environment such that the etch resistance of the recessed features to an etchant compared to the layer comprising the second metal is increased,
  partially etching, with the etchant, the layer comprising the second metal, thereby forming a recessed layer, such that the layer still remains between the filling material and the pattern of recessed features,
  exposing the substrate to a second ambient environment such that the modification of the recessed features is at least partially reversed.

The first aspect facilitates manufacturing a semiconductor structure, whereby wet-chemical dissolution or undesired corrosion of different layers comprising different metals is avoided during etching.

The first aspect facilitates recessing different layers, comprising different metals, with respect to each other without wet-chemical dissolution or undesired corrosion when non-selective etching cannot be guaranteed or is occurring at a level that is not sufficient.

The first aspect facilitates manufacturing semiconductor structures that can lead to reliable fabrication of semiconductor devices and to reliable semiconductor devices obtained therefrom.

The first aspect facilitates integrating layers, which are to be used as interconnects, comprising metals such that they are targeting to keep RC delay reduced as feature sizes keep on shrinking in the semiconductor industry.

The first aspect facilitates integrating layers, which are to be used as buried power rails, such that a metal prone to corrosion or, in other words, dissolution is temporarily protected during a series of wet-chemical treatments.

Particular and preferred aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

BRIEF DESCRIPTION OF THE FIGURES

The above, as well as additional features, will be better understood through the following illustrative and non-limiting detailed description of example embodiments, with reference to the appended drawings. In the drawings, the size of some of the elements may be exaggerated and not drawn on scale for illustrative purposes. The dimensions and the relative dimensions do not correspond to actual reductions to practice.

Figure 1:
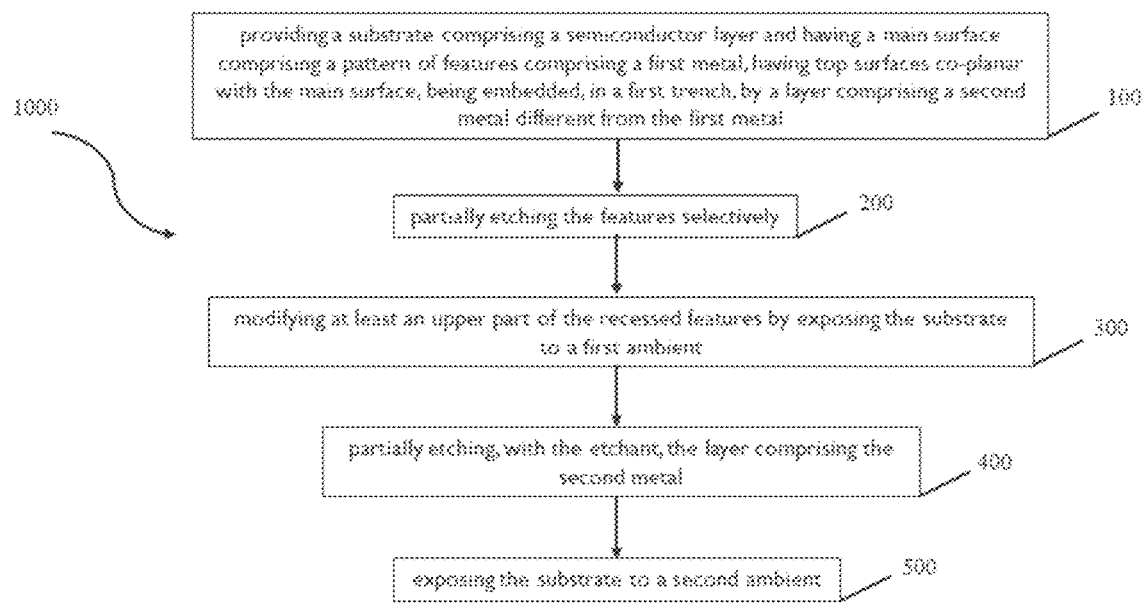
FIG. 1 is a flowchart representing a method, in accordance with a first example aspect.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The terms first, second, third, and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising," therefore, covers the situation where only the stated features are present and the situation where these features and one or more other features are present. The word "comprising," therefore, also includes as one embodiment that no further components are present. Thus, the scope of the expression "a device comprising means A and B" should not be interpreted as being limited to devices consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments, various features are sometimes grouped in a single embodiment, figure, or description thereof for the purpose of streamlining the description and aiding in the understanding of one or more of the aspects disclosed herein. This method of disclosure, however, is not to be interpreted as reflecting an intention that the claimed aspects require more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some, but not other features included in other embodiments, combinations of features of different embodiments are meant to be within the scope of the claims, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the claimed aspects.

In the description provided herein, numerous specific details are set forth. However, it is understood that embodiments may be practiced without these specific details. In other instances, well-known methods, structures and techniques have not been shown in detail in order not to obscure an understanding of this description.

The following terms are provided solely to aid in understanding the disclosure.

As used herein, and unless provided otherwise, the term "RC delay" refers to the fact that the electrical equivalent circuit of an interconnect line is an RC circuit, in which "R" is the resistance, which is linked to line material properties (resistivity) as well as the length of the lines; "C" is the capacitance, for which the dielectric material surrounding the interconnect line plays the major role. RC delay as such is a characteristic number, which can become a factor of increasing importance during further miniaturization of integrated circuits. By a careful choice of materials, one is able to minimize its value, thereby allowing one to increase the clock speed, which, in turn, enhances the performance of the entire system.

As used herein, and unless provided otherwise, the term "IR drop" refers to voltage drop over a conductor line, the value of which should be kept as low as possible. Both the current (I) flowing through the conductor as well as the resistance (R) of the conductor, which is directly linked to the metal's resistivity, facilitate determining the value of the IR drop of the conductor.

Both the RC delay and the IR drop are seen as "performance metrics" for a given interconnect design (line length, width, depth) and metals used in that system.

As used herein, and unless provided otherwise, the term "strong oxidizing agent" refers to an agent for which the onset potential for its reduction has a value more positive than the onset potential for the anodic dissolution (stripping) of the metal that one desires to wet-chemically dissolve. Under these conditions, the metal will spontaneously be oxidized when exposed to a solution containing the oxidizing agent.

As used herein, and unless provided otherwise, the term "surficial nitridation" refers to having a nitridated layer sufficiently thick so as to withstand the removal process of the layer comprising the second metal. During the partial etching of the layer comprising the second metal, some removal of the nitridated material can be tolerated, however, upon removal of this layer up to the desired level, there should preferably be some nitridated first metal left.

The disclosure will now be described by a detailed description of several embodiments of the disclosure. It is clear that other embodiments can be configured according to the knowledge of the persons skilled in the art without departing from the technical teaching of the disclosure.

Figure 2:
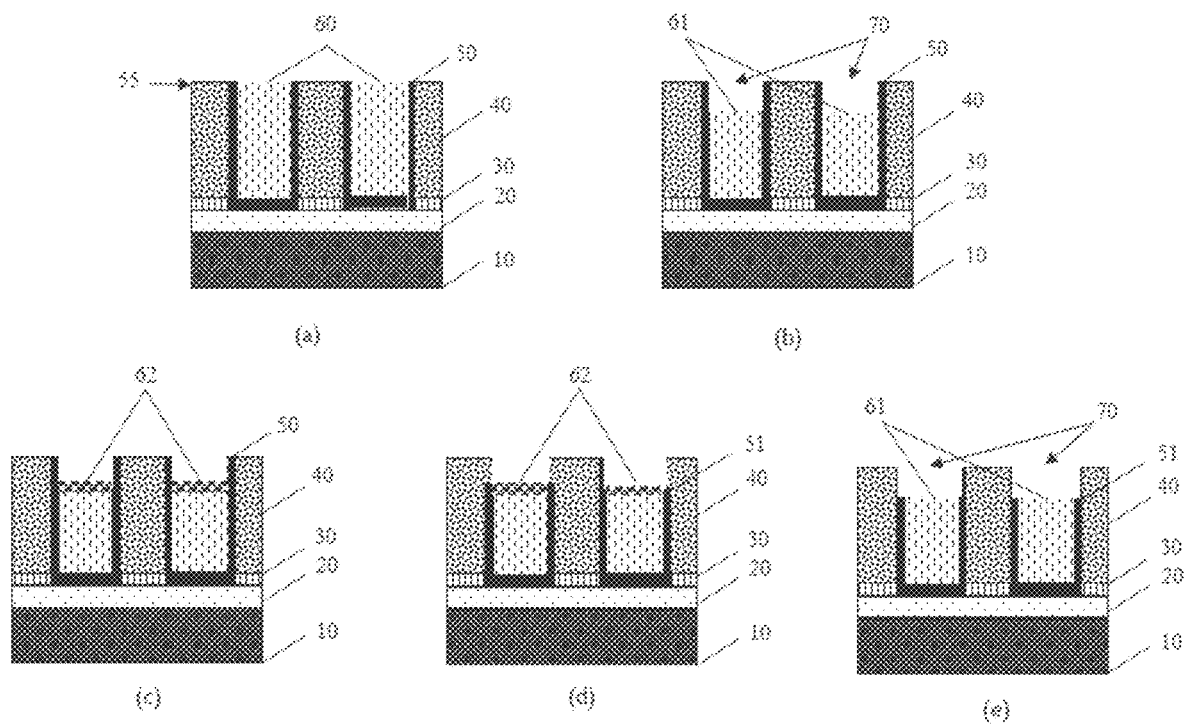
FIG. 2a to FIG. 2e show schematic representations of process steps, in sequential order, in accordance with an example embodiment of the first aspect.

We now refer to FIG. 1 showing a flowchart representing a method (1000) according to a first aspect and FIG. 2 showing a schematic representation of the process steps, in sequential order, as used in embodiments of the first aspect.

The method (1000) comprises providing a substrate (100). This substrate comprises a semiconductor layer (10) and has a main surface (55) comprising a pattern of features (60) (FIG. 2a). In embodiments, this semiconductor layer (10) may be a monocrystalline silicon layer. This monocrystalline silicon layer may be a Si(111) or Si(100) layer. The substrate may comprise other layers (20) overlying the semiconductor layer that are necessary for manufacturing the semiconductor structure. The pattern of features comprises a first metal.

In example embodiments, the first metal has a low resistivity value. For instance, examples of the first metal correspond to copper, cobalt, nickel, ruthenium, or molybdenum. In the manufacturing of a semiconductor structure, such metals can be used as carriers for electrical signals because low resistivity values lead to low resistance and, thus, faster signal propagation in a transistor.

In example embodiments, this first metal is molybdenum. Use of molybdenum as the first metal facilitates not only increased reliability to the patterned features in terms of processing, but also offers reduced costs for the fabrication.

Furthermore, molybdenum, compared to copper, for example, has higher resistance against electromigration, which makes it particularly useful in the patterning of features such as interconnects. In addition, molybdenum facilitates a reduced RC delay, thus, making molybdenum a more suitable choice of metal. Reduced RC delay, in turn, results in high-speed switching capacity and faster working semiconductor devices.

On the other hand, when the pattern of features is being implemented, such as for instance, as buried power rails, molybdenum provides a reduced IR drop. A reduced IR drop results, in turn, in faster signal propagation and decreased resistive losses in the interconnects.

In embodiments, the pattern of features comprising the first metal may comprise an alloy of the first metal. Thus, in such embodiments, the pattern of features comprising the first metal may comprise an alloy such as for instance RuAl or $Ni_3Al$. These alloys provide low resistivity. When the pattern of features are interconnect lines, having such low resistivity alloys results in reduced resistance thus, resulting in reduced RC delay.

These pattern of features (60) have top surfaces that are coplanar with the main surface (55) and they are embedded, in a first trench, by a layer (50) comprising a second metal, which is different from the first metal.

Thus, in embodiments, the layer (50) comprising the second metal may surround each of the patterned features (60) inside the first trench from lateral sides and from the bottom.

The patterned features (60) are separated at least partially by a filling material (40). A large separation between the patterned features (60) facilitates a reduction in the impact of diffusion of the first metal comprised in the pattern of features (60) into the filling material (40), which can otherwise lead to defect formation or would lead to the shorting of two neighboring features, resulting in the misfunctioning of the semiconductor device that can be made by using this semiconductor structure. However, the increased separation of neighboring features reduces the chip's interconnect density when the patterned features (60) are, for example, interconnects. Therefore, the layer (50) comprising the second metal is introduced. This layer thus acts as a diffusion barrier. After chemical mechanical planarization, the filling material (40) and the diffusion barrier layer (50) have top surfaces coplanar with the top surfaces of the patterned features (60).

In embodiments, the second metal comprised in the layer (50) may be Ti, Ta, or W. In alternative embodiments, the layer (50) comprising the second metal may be a bilayer, at least one of which may comprise the second metal, such as for instance Ti/TiN, Ta/TaN, W/WN, or W/WCN.

This layer (50) comprising the second metal can also serve as an adhesion layer in order to provide good adhesion of the pattern of features comprising the first metal to the filling material. In embodiments where the layer comprising the second metal would be used for this purpose, the layer comprising the second metal may be a nitride of the second metal, such as, for instance, TiN, TaN, WN or WCN. In preferred embodiments, where the first metal comprised in the pattern of features (60) is molybdenum, the layer (50) comprising the second metal may be TiN to act as the adhesion layer.

These features of the pattern are separated from each other, at least partially, by a filling material (40). Thus, the first trench is implicitly made in the filling material (40).

When molybdenum is comprised in the pattern of features (60), the layer (50) comprising the second metal acts as an adhesion layer for nucleating molybdenum and it can, in some examples, be provided along the inner walls of a trench made in the filling material before providing the pattern of features (60). This adhesion layer provides nucleation of the molybdenum, which otherwise would be challenging to deposit directly on the filling material (40). The thickness of this adhesion layer may be in the range of 0.5 nm to 5 nm.

In embodiments, the filling material may be a dielectric material. This dielectric material may, in embodiments, be silicon oxide. In alternative embodiments, this dielectric material may be a low-k dielectric material.

The layer comprising the second metal (50) and the filling material (40) have a top surface that is coplanar with the top surfaces of the pattern of features (60) (FIG. 2a). This implicitly means that the top surface of the layer comprising the second metal, the top surface of the filling material, and the top surface of the pattern of features are all coplanar with the main surface (55). Such co-planarity may be obtained as a result of a planarization process, such as for example chemical mechanical planarization process (CMP).

Separation between the pattern of features (60) may also involve, in addition to the presence of the filling material, the presence of a hard mask layer (30) (FIG. 2a). This hard mask layer acts as a separation layer between the filling material (40) and the other layers (20) overlying the substrate (10). As such, when the first trench is made in the filling material, it extends downwards, stopping on a top surface of the other layers (20).

The pattern of features is partially etched selectively (200). As a result of this selective partial etch process, a pattern of recessed features (61) is formed (FIG. 2b). The depth of the recess (70) formed can be adjusted by controlling the etching time. In some embodiments, the etching time can be adjusted such that the depth of the recess (70) made is more than half of the depth of the first trench. While in other embodiments, it may be necessary, depending on the application, to adjust the etching time such that the depth of the recess (70) made is less than half of the depth of the first trench.

This selective partial etching process is done to etch the pattern of features (60) is known to persons skilled in the art.

The method (1000) continues with the modification (300) of at least an upper part of the recessed features (61), thus forming a modified portion (62). This is done by exposing the substrate to a first ambient environment. This modified portion (62) has increased etch resistance to an etchant compared to the layer comprising the second metal (50). This etchant may be an etchant that will be used to recess the layer comprising the second metal (50). This modified portion (62) may act electrochemically more noble compared to the second metal comprised in the layer during etching of this layer (50). This makes it is more difficult to chemically wet-etch the modified portion (62) and, therefore, makes it less susceptible to corrosion. As such, when non-selective etching cannot be guaranteed or is occurring at a level that is not sufficient, further etching of the recessed features (61) is avoided thanks to this modified portion (62).

Due to the presence of this modified portion (62), the depth of the recess (70) formed as a result of partial etching (200) of the features (60) is maintained during the recessing of the layer (50) comprising the second metal.

In embodiments, this first ambient environment may comprise nitrogen (N), carbon (C) or boron (B). Subjecting the substrate to such a first ambient environment results in the formation of a metallic compound with the first metal (M) comprised in the pattern of features (60) as a result of the modification, such as for example, metal nitride, metal carbide or metal boride.

In embodiments, the first ambient environment comprises nitrogen. As such, modifying the at least the upper part of the recessed features (61) may be achieved by performing a nitridation process.

In embodiments, this nitridation process may comprise exposing the substrate to a nitrogen-comprising ambient environment. This exposure may be done at a temperature in the range of 175° C. to 700° C. This temperature range is suitable for semiconductor manufacturing and within this temperature range, the temperature can be adjusted depending on the specific process that needs to be used as a function of the specific module to be integrated.

In example embodiments, the first ambient environment comprising nitrogen and thus the modification of the upper part being done by the nitridation process in the temperature range of 175° C. to 700° C. may be applied when the first metal comprised in the pattern of features (60) is molybdenum due to the above-stated aspects linked to the choice of molybdenum.

In embodiments, this nitridation process may be done alternatively, whereby the nitrogen-comprising ambient environment may be a plasma generated from a nitrogen-containing gas, and the nitridation process may be performed at a temperature in the range of 175° C. to 250° C. It is within the expertise of skilled persons in the art to generate the plasma from a nitrogen-containing gas. This alternative way of nitridation is useful for processes where thermal budget limitations may play a role due to reliability issues associated with sensitive structures that are already comprised in the substrate as a result of earlier processes performed.

In such embodiments, using molybdenum as the first metal facilitates undergoing this alternative nitridation process.

In yet alternative embodiments, this nitrogen comprising ambient environment may be forming gas, and the nitridation process may be performed at a temperature in the range of 500° C. to 700° C. In an example, this alternative nitridation process is used in the given temperature range since the modified upper portion (62) shows more nobility providing better protection against wet-etch and/or corrosion when the layer (50) comprising the second metal needs to be recessed.

In embodiments, the exposure to forming gas may be done at a temperature in the range of 500° C. to 660° C.

In preferred embodiments, the nitridation process may be performed by exposure to forming gas at 650° C.

Without wishing to be bound by theory, it is expected that the reason why exposure to forming gas provides more nobility may have to do with the presence of hydrogen gas in the forming gas. Hydrogen gas is able to reduce the native molybdenum oxide present on the surface of the pattern of features (60), thus exposing metallic molybdenum. Nitrogen in the forming gas then forms a nitride with the exposed and cleaned molybdenum, thus making up the modified portion (62).

In embodiments, this forming gas may have a composition of 10% (v) $H_2$ and 90% (v) $N_2$. This composition of forming gas is industrially compatible. However, other compositions of forming gas, which can modify the at least upper part of the recessed features (61), thereby forming a noble modified upper portion (62) that is resistant to the etchant can also be used.

Thus, in embodiments, the nitrogen-comprising ambient environment may be a gas comprising $N_2$ and the nitridation process may comprise, before exposing the substrate to the nitrogen comprising ambient environment, exposing the substrate to another gas comprising $H_2$.

In embodiments, this gas consisting essentially of $H_2$ may comprise 99% volume $H_2$.

In embodiments, the gas consisting essentially of $N_2$ may comprise 99% volume $N_2$.

This may open up an alternative route for the nitridation process, where the native surface oxide is reduced due to hydrogen gas, and the subsequent exposure of the substrate to nitrogen gas then modifies the upper part of the recessed features (61) thus, forming the modified upper part (62).

Adjusting the time of exposure to the gas consisting essentially of $N_2$, one can control the thickness of the modified portion (62), i.e., the thickness of the nitridated layer due to the exposure to nitrogen gas. In wet etch situations, where a reasonable etch selectivity does not exist between the modified portion (62) and the layer (50) comprising the second metal during recessing of the layer (50), a thicker modified portion (62) facilitates providing the desired protection of the recessed features (61) during etching.

In embodiments, exposing the substrate to this gas consisting essentially of $H_2$ and exposing the substrate to the nitrogen comprising ambient environment, which is the gas consisting essentially of $N_2$, may be done under vacuum. This can, for example, be with a wafer transfer under a vacuum. These two subsequent processes are done without air-break, thus reducing the chance of getting the surface of the recessed features (61) oxidized again. This way, direct nitridation of the recessed features (61) can be achieved.

Anodic stripping voltammograms give an indication of wet-chemical dissolution behavior that can be expected during etching, such as for instance, when recessing features or during a chemical mechanical planarization (CMP) process.

Figure 3:
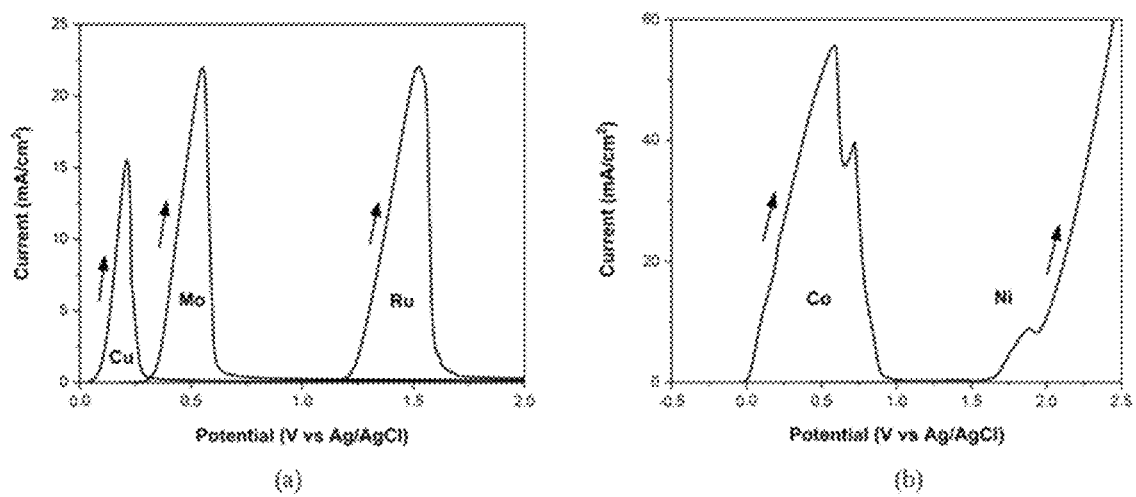
FIG. 3a and FIG. 3b show anodic stripping voltammogram of metals, in accordance with example embodiments.

FIG. 3(a) shows a comparison of anodic stripping voltammograms of different metals, namely of copper, molybdenum, and ruthenium, performed in 0.5 M $H_2SO_4$. These samples are blanket metal films deposited on a silicon substrate. Such measurements indicate at which potential the metal can electrochemically be oxidized and dissolved. This, in turn, can be used, for example, to determine which oxidizing agents should be able to wet-chemically dissolve, i.e., wet-etch, the metal.

As seen from FIG. 3(a), ruthenium can only be etched or, in other words, dissolved using strong oxidizing agents, such as for instance Cerium (IV) ($Ce^{+4}$) in acidic or hypochlorite (OCL) in alkaline solution. Copper, on the other hand, easily dissolves or etches or corrodes, for instance, in oxygen-containing solutions. Referring to FIG. 3(a), thus, it can be concluded that copper, for instance, happens to be the least noble metal having a stripping onset potential of +0.1 V, while ruthenium happens to be the most noble with a stripping onset potential of +1.2 V. Molybdenum, on the other hand, happens to have an intermediate value of stripping onset potential of +0.3 V.

Another reason for choosing molybdenum is that copper can potentially cause reliability problems, such as for instance electromigration. And ruthenium is an expensive metal with limited availability, thus posing a potential challenge on the manufacturing costs. Furthermore, even though ruthenium is potentially a good candidate to be the first metal comprised in the pattern of features (60), which is already used in semiconductor technology, molybdenum is easier to wet-etch; i.e., for recessing the features, compared to ruthenium while damage to other exposed structures is kept to a minimum.

Referring to FIG. 3(b), on the other hand, showing a comparison of anodic stripping of cobalt and nickel, which are again deposited blankets on a silicon substrate, it is seen that cobalt has a stripping onset potential of +0.5 V, while nickel has a value higher than +2.0 V. Even though cobalt also presents itself as a potential candidate as the first metal, it should be kept in mind that use of molybdenum can be an improvement over cobalt since it can, in some examples, be provided in the first trench in the absence of a layer comprising the second metal (50). This then facilitates reducing the manufacturing costs and reducing the number of lot-turns during manufacturing.

Figure 4:
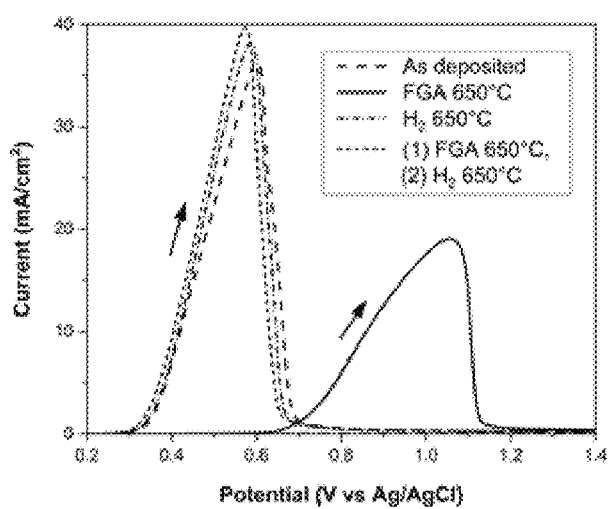
FIG. 4 shows anodic stripping voltammogram of molybdenum after different treatments, in accordance with example embodiments.

Now, referring to FIG. 4, which shows anodic stripping of molybdenum for different treatments applied with the as-deposited molybdenum acting as the reference. Molybdenum is deposited by Physical Vapor Deposition (PVD) as a blanket film with a thickness of 100 nm on a $SiO_2$ coated silicon substrate in these examples. The onset potential of metallic molybdenum is +0.3 V. It is observed that treatment done by exposure of the substrate to forming gas at 650° C. causes a shift of the anodic current onset to a more positive value, which implies an increase in the etch resistance. A stripping onset potential of about +0.62 V is achieved. The difference in onset potentials indicates ease of dissolution, in other words, ease of wet-etching or corrosion. With the increased onset potential for molybdenum after exposure of the substrate to forming gas at 650° C., it becomes more difficult for molybdenum to wet-etch or corrode or dissolve, in other words. This is because, in nitridated molybdenum, the Mo atoms are more firmly anchored in the matrix as compared to in the metallic matrix.

Figure 5:
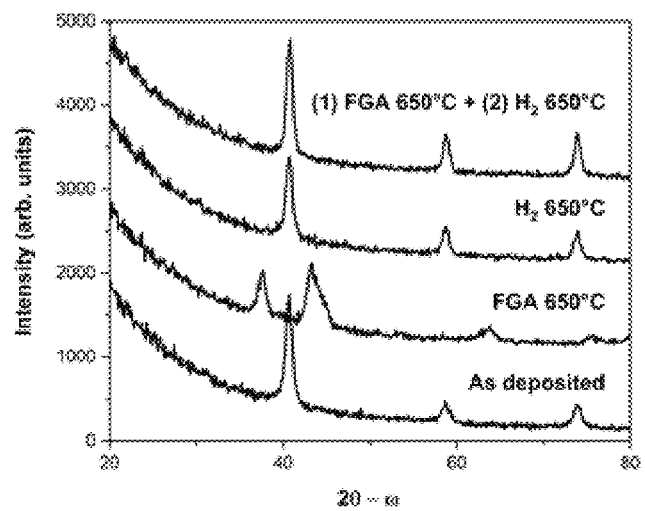
FIG. 5 shows grazing incidence X-Ray Diffraction (XRD) measurement results of molybdenum after exposure of the substrate to forming gas and/or hydrogen gas at 650° C. for 20 minutes, in accordance with example embodiments.

Referral to FIG. 5 provides further evidence supported by grazing incidence X-Ray Diffraction (XRD) measurements that after exposure of the substrate to forming gas at 650 C for 20 minutes, new peaks appear on both sides of $2\Theta=40°$ as an indication of molybdenum nitride.

Figure 6:
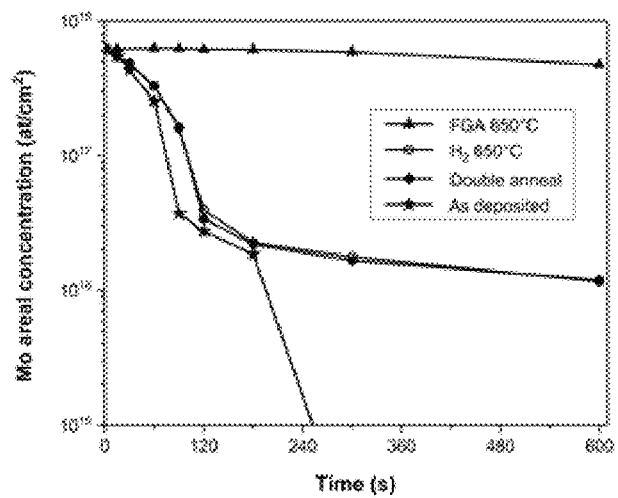
FIG. 6 shows wet etching experiments conducted in an oxidizing liquid, in accordance with example embodiments.

Wet etching experiments conducted in an oxidizing liquid of, such as for instance, 30% (v) $H_2O_2$ for molybdenum samples treated by exposure to forming gas at 650° C. for 20 minutes show a rather constant molybdenum areal concentration (at/$cm^2$) as a function of exposure time to this wet etch solution during the first few minutes after which etching occurs at an extremely low rate (3 nm/min) (FIG. 6). Whereas the as-deposited sample starts to get etched (62 nm/min.) directly from the start of exposure to this wet etch solution. This supports the fact that by modifying molybdenum, its etch resistance is increased. Furthermore, it should be noted that for a wet etching process, the typical concentration is in the range of 0.01 to 1% (v) $H_2O_2$.

In embodiments, the nitridation process may be performed for a duration of less than 20 minutes. This leads to surficial nitridation, which facilitates a reduction in volume expansion upon nitridation. This, in turn, reduces the risk of mechanical damage to the layer (50) comprising the second metal and/or to the filling material and/or to the layers or structures comprised in the substrate. In preferred embodiments, the nitridation process may be performed for a duration in the range of 10 to 20 minutes to get the surficial nitridation.

Figure 7:
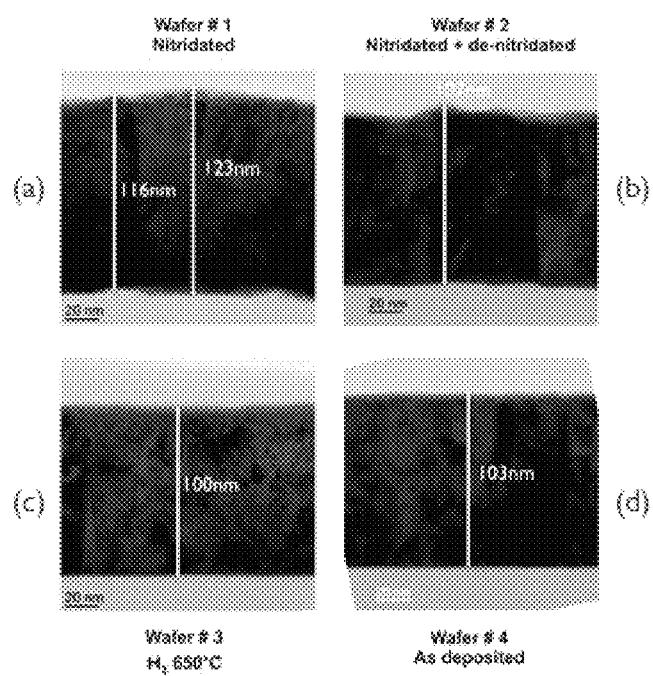
FIG. 7 shows cross-sectional transmission electron microscope images, in accordance with example embodiments.

This aspect can be inferred from the cross-sectional transmission electron microscope images (X-TEM) presented in FIG. 7. It is observed that some degree of expansion occurred after nitridation, which is done by exposure to forming gas at 650° C. for 20 minutes (FIG. 7a), as compared to the as-deposited sample (FIG. 7d) as judged by the increase in the thickness (116 nm; 123 nm). However, following exposure to hydrogen gas at 650° C. for 20 minutes (FIG. 7b) subsequent to nitridation, the thickness of the sample (107 nm) is closer to that (103 nm) of the reference sample (FIG. 7d). FIG. 7c shows the image of another sample after exposure to $H_2$ at 650° C. for 20 minutes.

Figure 8:
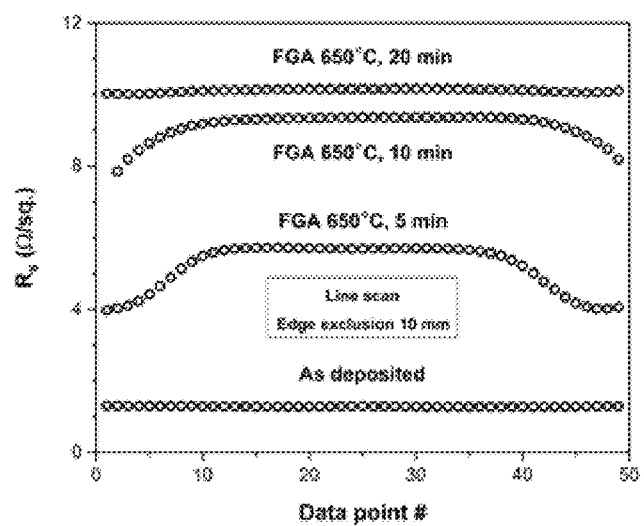
FIG. 8 shows sheet resistance values, in accordance with example embodiments.

FIG. 8 presents the sheet resistance values obtained, such as for instance, for molybdenum film deposited blanket, with a nominal thickness of 100 nm, on the substrate following exposure to forming gas at different times of exposures.

Increasing values for sheet resistance ($R_S$) of molybdenum as a function of time of exposure is an indication of the fact that the thickness of the modified portion (62) is increasing, which in turn means that the thickness of the molybdenum itself is decreasing due to the thickness being build up as a result of modification since it is known to persons skilled in the art that sheet resistance ($R_S$) is expressed in terms of Ω/square as:

$$Rs = \frac{\rho}{t} \quad\quad \text{Eq. (1)}$$

with ρ referring to resistivity and t referring to the thickness of the remaining film.

Observing FIG. 8 also hints at another aspect of surficial nitridation. As seen from the graph, the fact that shorter exposure times lead to a thinner modified portion (62) would, in turn, ease the de-nitridation process in terms of timing. Thus, less time of exposure to the second ambient environment is inherently foreseen.

The method (1000) continues with the partial etching (400) of the layer comprising the second metal (50) with the etchant. This then forms a recessed layer (51) (FIG. 2d). This partial etching is done such that the recessed layer (51) still remains between the filling material (40) and the pattern of recessed features (61). Partial etching of the layer (50) is known to persons skilled in the art. It is also known to persons skilled in the art that partial etching of the features selectively (200) and partial etching of the layer (400) are done using etchants with differing etch chemistries. This partial etching of the layer (50) thus, preferably can continue until the top surface of the recessed layer (51) abuts the top surface of the modified portion (62) such that it still remains in between the recessed features (61) and the filling material (40)

The method (1000) further continues with exposing (500) the substrate to a second ambient environment such that the modification (62) of the recessed features (61) is at least partially reversed. Depending on the process integration, device design, and the final application, this aspect offers some tolerance towards residual amounts of nitrogen.

In embodiments, this partial reversal may be such that the percentage (%) recovery in the resistivity is at least 80%.

In preferred embodiments, exposing the substrate to the second ambient environment may be such that the modification of the recessed features is fully reversed. This reversal of the modification results in obtaining the metallic form of the first metal comprised in the pattern of recessed features (61) (FIG. 2e). This reversal also means implicitly converting the electrochemically more noble modified layer (62) into the first metal in its metallic state.

In an example, reversing the modification of the recessed features (61) fully facilitates the restoration of the resistivity of the first metal. Restoration of resistivity is important since it has a direct relationship with the resistance of the recessed patterned features (61). Any increase in resistivity, thereby leading to an increase in resistance, would result in a reduced speed of electrical signals provided through the recessed patterned features (61). Not being able to restore the resistivity in embodiments, where the first metal may be copper, cobalt, molybdenum, ruthenium or nickel, thus leads to diminished aspects associated with the choice of these metals.

Figure 9:
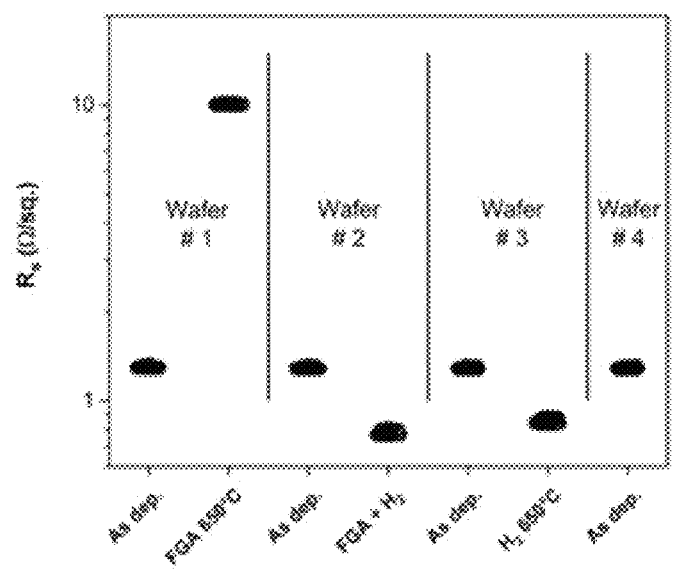
FIG. 9 shows a change in sheet resistance as a function of different treatments applied on a blanket molybdenum film, in accordance with example embodiments.

FIG. 9 shows the change in sheet resistance as a function of different treatments applied on a blanket molybdenum film deposited on a $SiO_2$ coated substrate. It is observed that subjecting the substrate to forming gas at 650° C. for 20 minutes followed by hydrogen gas at 650° C. for 20 minutes restores the sheet resistance (wafer #2) back in the neighborhood of the sheet resistance value of the as-deposited film. Therefore, in embodiments, the sheet resistance after de-nitridation may be at least 80% of the sheet resistance before de-nitridation. This also infers that, in embodiments, the resistivity after de-nitridation may be at least 80% of the resistivity before de-nitridation. The further decrease observed in the sheet resistance is due to the increase in grain size that has occurred as a result of grain growth that took place at the high temperatures of the treatments. This is supported by the plan-view TEM images presented in FIG. 10d.

In embodiments, this second ambient environment is a $H_2$ comprising ambient environment and exposure may be done at a temperature in the range of 500° C. to 700° C.

In embodiments, this hydrogen comprising ambient environment may be a gas consisting essentially of $H_2$. In example embodiments, this gas may consist only of $H_2$.

In alternative embodiments, this hydrogen comprising ambient environment may be a plasma generated from a gas consisting essentially of $H_2$.

Referring to FIG. 4, it shows that after exposure of the substrate, thus exposure of the nitridated film, to the hydrogen gas at 650° C., the onset potential of the material (+0.3 V) is identical to that of metallic molybdenum (as deposited=+0.3 V). This infers that the modified upper portion (62) of the recessed features (61) is reversed back to a metallic state.

Figure 10:
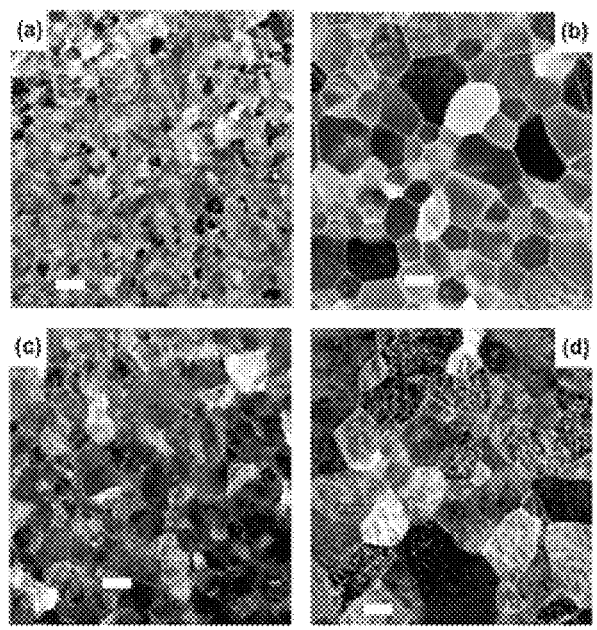
FIG. 10 shows plan-view transmission electron microscopy images, in accordance with example embodiments.

Referral to FIG. 5 provides further evidence that after exposure of the substrate to the hydrogen gas at 650° C., peak positions are exactly the same as metallic molybdenum peaks, which belongs to the "as-deposited" case on the same graph. The fact that the peaks, in this case, are sharper than the as-deposited molybdenum peaks can be attributed to the fact that grain size has increased. This is supported by the plan-view transmission electron microscopy (TEM) images taken from blanket molybdenum films of 100 nm thick provided on the substrate and provided in FIG. 10a for the as-deposited case in comparison to the case following hydrogen gas exposure at 650° C. for 20 minutes, which is done after exposure to forming gas at 650° C. for 20 minutes as shown in FIG. 10d. The white scale in these images indicates a scale of 50 nm. It is also noted that exposure to only hydrogen gas at 650° C. for 20 minutes (FIG. 10b) and exposure to only forming gas at 650° C. for 20 minutes (FIG. 10c) results in an increase in grain size. Therefore, in embodiments, the grain size after de-nitridation may be greater than grain size before de-nitridation. However, the highest increase in grain size is seen when both treatments subsequently follow each other, as shown for instance, in FIG. 10d.

Figure 11:
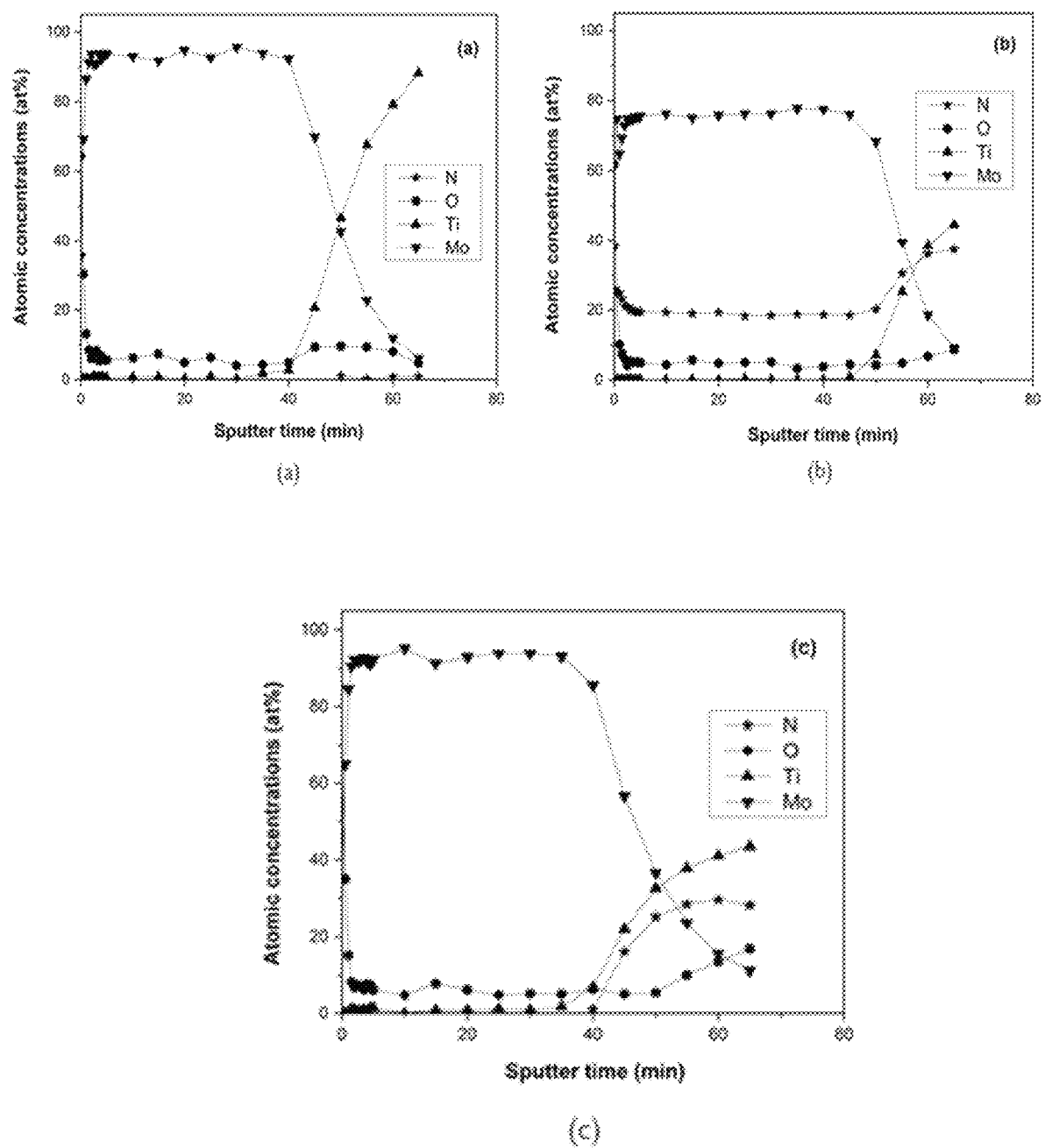
FIG. 11 shows X-ray Photoelectron Spectroscopy (XPS) depth profiles, in accordance with example embodiments.

X-ray Photoelectron Spectroscopy (XPS) depth profiles obtained on samples having 100 nm of blanket Mo deposited on the substrate indicate that as a result of exposure to forming gas at 650° C. for 20 minutes, nitrogen is present throughout the whole thickness of the molybdenum layer, as shown for instance in FIG. 11b; whereas in the as-deposited sample (FIG. 11a), nitrogen is almost not present. Exposure, thereafter, to only hydrogen gas at 650° C. for 20 minutes (FIG. 11c) indicates that the molybdenum sample is free from nitrogen throughout its whole thickness, supporting the fact that the modified upper portion (62) of the recessed features (61) is reversed back to its metallic state.

The fact that the exposure of molybdenum to hydrogen gas at 650° C. for 20 minutes, which follows the exposure to forming gas at 650° C. for 20 minutes, brings it back to the metallic state is also supported by wet etch experiments conducted by exposure to the oxidizing liquid of, such as for instance, 30% (v) $H_2O_2$ as shown in FIG. 6. Samples following this so-called double anneal indicates being etched as judged by the decrease in the molybdenum areal concentration as a function of etching time.

An embodiment relates to a method of forming a self-aligned via for interconnect structures. The method may comprise manufacturing a semiconductor structure according to any embodiments wherein the pattern of features (60)

comprising the first metal may be interconnect lines and wherein the first trench may extend down within the filling material (40). An interlayer dielectric (40) material may be provided overlying the pattern of recessed features (61), the recessed layer (51) and the filling material (40). In embodiments, this interlayer dielectric (40) may be silicon oxide. In alternative embodiments, this interlayer dielectric material may be a low-k dielectric material.

Figure 12:
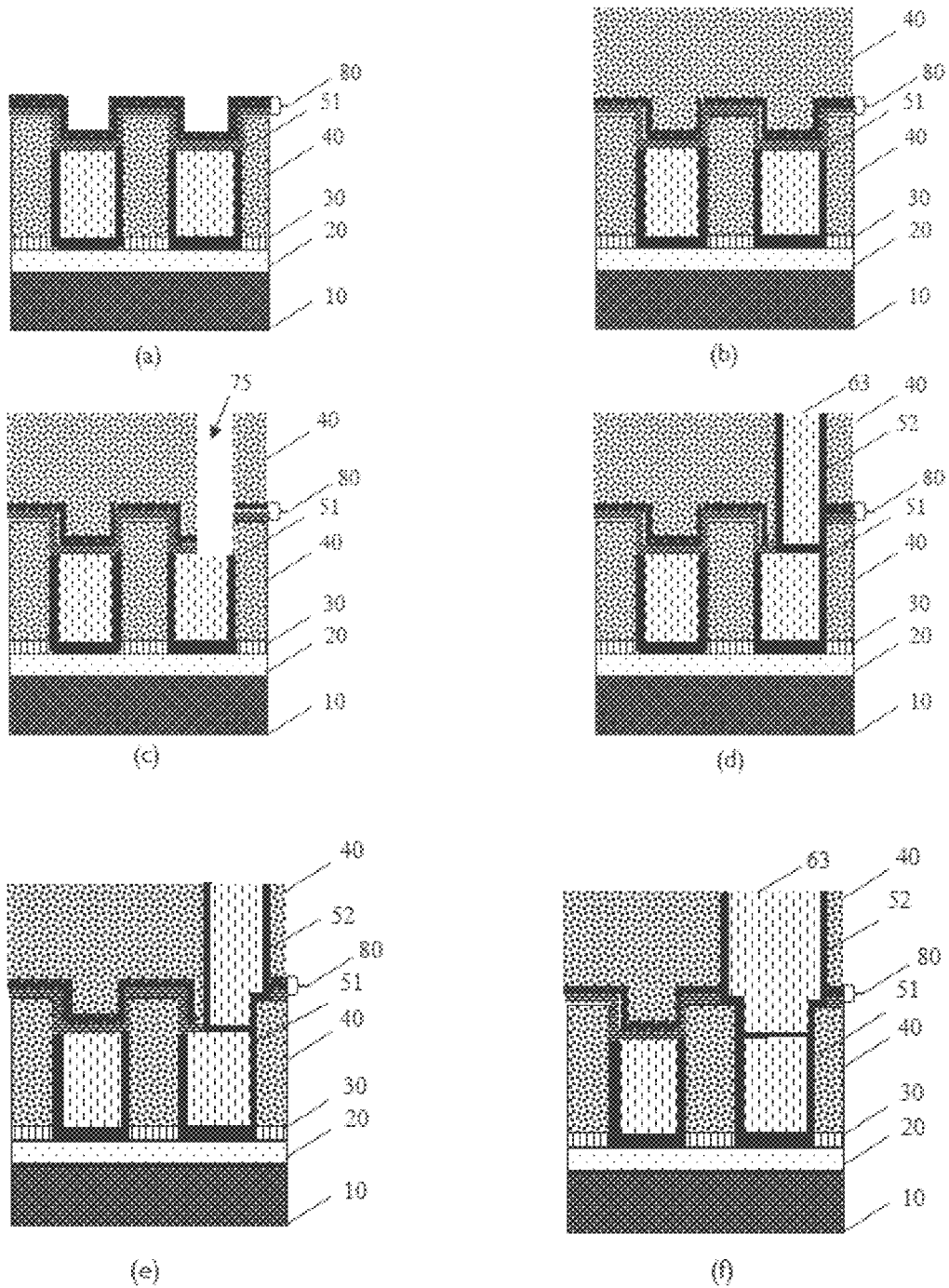
FIG. 12 shows a semiconductor structure during various processing phases, in accordance with example embodiments.

In embodiments, before providing the interlayer dielectric material (40) overlying the pattern of recessed features (61), the recessed layer (51) and the filling material (40), a dielectric cap (80) may be provided as shown for instance in FIG. 12a. This dielectric cap may be a single layer of a dielectric material or a bilayer, and in some examples, having properties of acting as a hard mask layer. In embodiments, this dielectric cap may thus, be a layer of silicon nitride or silicon oxide. This dielectric cap may, in an example, be in contact with the exposed surfaces of the filling material (40), the recessed pattern of features (61), and the recessed layer comprising the second metal (51).

A patterning process may be performed in order to form a second trench (75) in the interlayer dielectric material (40). This patterning process may comprise a lithography process and an etch process, thereby forming the second trench (75) (FIG. 12c). This second trench (75) may have a bottom exposing, at least partially, a top surface of the pattern of recessed features (61).

In embodiments, this patterning process may be done such that the bottom of the second trench (75) may expose fully the surface of the pattern of recessed features (61) (FIG. 12f) and additionally the filling material on both sides of the pattern of recessed features (61). In alternative embodiments, the bottom of this second trench (75) may also expose the filling material (40) on either side (FIG. 12e) in addition to partial exposure of the top surface of the pattern of recessed features (61).

Further on, a via (63) for an electrical contact may be formed in the second trench (75) by filling the second trench (75) with a layer comprising a third metal.

In embodiments, before filling the second trench (75) with the layer comprising the third metal, a third layer (52) comprising a fourth metal may be provided on the inner walls of the second trench (75). This fourth metal may, in embodiments, be the same as the second metal comprised in the layer (50). This third layer also acts as a diffusion barrier to avoid the diffusion of the third metal into the interlayer dielectric material (40).

In embodiments, the third metal may be the same as the first metal. Thus, the third metal, in example embodiments, may be copper, cobalt, molybdenum, ruthenium or nickel.

In example embodiments, this third metal may be molybdenum.

When molybdenum is comprised in the via (63), the third layer (52) comprising the fourth metal acts as an adhesion layer for nucleating molybdenum and it can, in an example, be provided along the inner walls of the second trench (75). This adhesion layer provides nucleation of the molybdenum, which otherwise would be challenging to deposit directly on the filling material (40) and on the interlayer dielectric (40). The thickness of this adhesion layer may be in the range of 0.5 nm to 5 nm.

Figure 13:
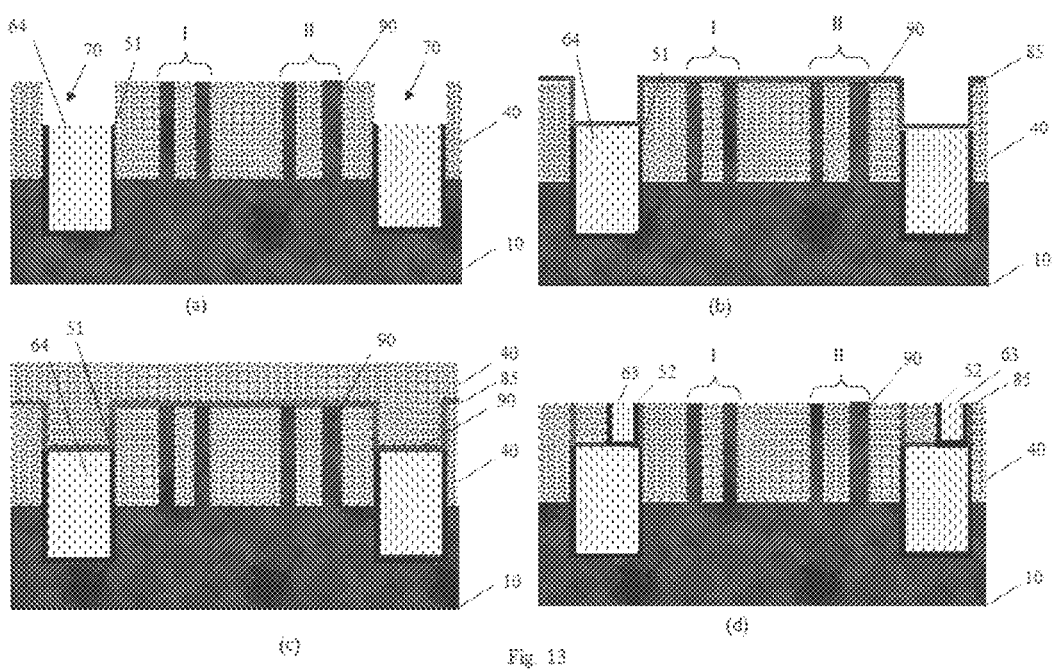
FIG. 13 shows a semiconductor structure during various processing phases, in accordance with example embodiments.

An embodiment relates to a method of forming a buried power rail for transistors. The method may comprise manufacturing a semiconductor structure according to any embodiments wherein the pattern of features (60) comprising the first metal may be buried power rails and wherein the first trench may extend down and into the semiconductor layer (10) as shown for instance in FIG. 13a. This semiconductor structure has fins (90) for the making of n-MOS (region I) devices and p-MOS (region II) devices (FIG. 13a). A via (63) for an electrical contact on each of the pattern of recessed features (64); i.e., recessed buried power rails, may be provided, wherein the via (63) may comprise a third metal.

In embodiments, this third metal may be the same as the first metal. Thus, the third metal, in embodiments, may be copper, cobalt, molybdenum, ruthenium or nickel.

In example embodiments, this third metal may be molybdenum, and when it is comprised in the via (63) (FIG. 13d), the third layer (52) comprising the fourth metal acts as an adhesion layer for nucleating molybdenum This adhesion layer provides nucleation of the molybdenum, The thickness of this adhesion layer may be in the range of 0.5 nm to 5 nm.

An interlayer dielectric (40) material may be provided overlying the pattern of recessed features (64), the recessed layer (51) and the filling material (40) (FIG. 13c). In embodiments, this interlayer dielectric (40) may be silicon oxide.

In embodiments, before providing the interlayer dielectric material (40) overlying the pattern of recessed features (64), the recessed layer (51) and the filling material (40), a dielectric cap (85) may be provided as shown for instance in FIG. 12a. This dielectric cap may be a single layer of a dielectric material or a bilayer, preferably having properties of acting as a hard mask layer. In embodiments, this dielectric cap (85) may thus, be a layer of silicon nitride or silicon oxide.

This dielectric cap (85) may, in an example, be in contact with the exposed surfaces of the filling material (40), recessed pattern of features (64) and recessed layer comprising the second metal (51) (FIG. 13b).

A patterning process may be performed in order to form a via opening in the interlayer dielectric material (40) (not shown in the figures). This patterning process may comprise a lithography process and an etch process, thereby forming the via opening. This via opening may have a bottom exposing, at least partially, a top surface of the pattern of recessed features (64).

Besides the field of applications disclosed regarding the method in the forming of self-aligned vias for interconnect structures and in the forming of buried power rails for transistors, a method according to the embodiments facilitates the manufacture of memory devices. Such memory devices are particularly suited for the manufacturing of 3D NAND or for storage-class memory (SCM) devices. Molybdenum may, for instance, be used for the word line or gate line formation. In some examples, the embodiments of the method are applied when performing the metal recess, i.e., molybdenum, followed by the liner recess in the manufacturing of such memory structures, thanks to the method facilitating metal recess independently and without damage with respect to the liner recess.

Thus, an example embodiment relates to a method of forming a memory structure. The method comprising manufacturing a semiconductor structure according to any embodiments wherein the pattern of features comprising the first metal may be a word line or a gate line and wherein the first trench extends within the filling material (40).

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for manufacturing a semiconductor structure, the method comprising:
providing a substrate that comprises a semiconductor layer and a filling material above the semiconductor layer, wherein the filling material defines a plurality of trenches in a surface opposite the substrate, wherein lateral sides of each trench are covered with a layer material that extends to the surface of the filling material and wherein each trench is filled with a feature material up to the surface of the filling material, wherein the feature material comprises a first metal and the layer material comprises a second metal different from the first metal;
partially etching the feature material of each trench selectively with respect to the layer material to form a pattern of recessed features;
exposing the substrate to a first ambient environment that increases an etch resistance of the pattern of recessed features to an etchant that facilitates etching of the layer material to thereby modify at least an upper part of the pattern of recessed features, wherein the first ambient environment comprises $N_2$, wherein modifying the upper part of the pattern of recessed features is achieved by performing a nitridation process;
partially etching the layer material with the etchant to form a recessed layer such that the layer material still remains between the filling material and the pattern of recessed features; and
exposing the substrate to a second ambient environment that at least partially reverses modification of the upper part of the pattern of recessed features.

2. The method according to claim 1, wherein the nitrogen gas comprising ambient environment is a plasma generated from the nitrogen gas, and the nitridation process is performed at a temperature in a range of 175° C.-250° C.

3. The method according to claim 1, wherein the first ambient environment comprises at least one of: nitrogen, carbon, or boron.

4. The method according to claim 1, wherein the layer material surrounds the feature material inside of each trench from lateral sides of the trench and from a bottom of the trench.

5. The method according to claim 1, wherein the nitrogen gas comprising ambient environment is forming gas, and the nitridation process is performed at a temperature in a range of 500° C.-700° C.

6. The method according to claim 5, wherein the nitridation process is performed for a duration of less than 20 minutes.

7. The method according to claim 1, wherein the second ambient environment is a hydrogen-comprising ambient environment and exposing the substrate to a second ambient environment is performed at a temperature in a range of 500° C.-700° C.

8. The method according to claim 7, wherein the hydrogen-comprising ambient environment is a gas comprising $H_2$ or a plasma generated from a gas comprising $H_2$.

9. A method of forming a self-aligned via for interconnect structures, the method comprising:
manufacturing a semiconductor structure according to claim 1, wherein the pattern of recessed features are interconnect lines and wherein a first trench extends down within the filling material;
providing an interlayer dielectric material overlying the pattern of recessed features, the recessed layer, and the filling material;
performing a patterning process, thereby forming a second trench in the interlayer dielectric material, the second trench having a bottom exposing, at least partially, a top surface of the pattern of recessed features; and
forming, in the second trench, a via for an electrical contact, the via comprising a third metal.

10. The method according to claim 9, wherein the third metal is the same as the first metal.

11. A method of forming a buried power rail for transistors, the method comprising:
manufacturing a semiconductor structure according to claim 1 wherein the pattern of recessed features comprising the first metal are buried power rails and wherein a first trench extends down and into the semiconductor layer; and
providing a via for an electrical contact on each of the pattern of recessed features, the via comprising a third metal.

12. The method according to claim 11, wherein the third metal is the same as the first metal.

13. The method according to claim 1, wherein the first metal comprises one or more of: copper, cobalt, molybdenum, ruthenium, or nickel.

14. The method according to claim 13, wherein the second ambient environment is a hydrogen-comprising ambient environment and wherein exposing the substrate to the second ambient environment is performed at a temperature in a range of 500° C.-700° C.

15. The method according to claim 13, wherein the first ambient environment comprises at least one of: nitrogen, carbon, or boron.

16. The method according to claim 15, wherein the nitridation process for modifying the upper part of the pattern of recessed features comprises exposing the substrate to a nitrogen-comprising ambient environment at a temperature in a range of 175° C. to 700° C.

17. The method according to claim 1, wherein the nitrogen gas comprising ambient environment is a gas comprising $N_2$ and the nitridation process comprises, before exposing the substrate to the nitrogen-comprising ambient environment, exposing the substrate to another gas comprising $H_2$.

18. The method according to claim 17, wherein the nitridation process is performed for a duration of less than 20 minutes.

19. The method according to claim 17, wherein exposing the substrate to the gas comprising $H_2$ and exposing the substrate to the nitrogen-comprising ambient environment is done under vacuum.

20. The method according to claim 19, wherein the nitridation process is performed for a duration of less than 20 minutes.

* * * * *